(12) United States Patent
Reed et al.

(10) Patent No.: US 9,331,231 B2
(45) Date of Patent: May 3, 2016

(54) PROCESS FOR CONTINUOUS DEPOSITION OF A SUBLIMATED SOURCE MATERIAL TO FORM A THIN FILM LAYER ON A SUBSTRATE

(71) Applicant: First Solar, Inc., Tempe, AZ (US)

(72) Inventors: Max William Reed, Niwot, CO (US); Stacy Ann Black, Longmont, CO (US); Scott Daniel Feldman-Peabody, Golden, CO (US); Mark Jeffrey Pavol, Arvada, CO (US)

(73) Assignee: First Solar, Inc., Tempe, AZ (US)

( * ) Notice: Subject to any disclaimer, the term of this patent is extended or adjusted under 35 U.S.C. 154(b) by 470 days.

(21) Appl. No.: 13/751,852

(22) Filed: Jan. 28, 2013

(65) Prior Publication Data

US 2013/0122631 A1 May 16, 2013

Related U.S. Application Data

(62) Division of application No. 12/765,316, filed on Apr. 22, 2010, now Pat. No. 8,361,229.

(51) Int. Cl.
*B05D 5/12* (2006.01)
*H01L 31/18* (2006.01)
*C23C 14/06* (2006.01)
(Continued)

(52) U.S. Cl.
CPC ........ *H01L 31/1876* (2013.01); *C23C 14/0629* (2013.01); *C23C 14/24* (2013.01); *C23C 14/562* (2013.01); *H01L 31/1828* (2013.01); *Y02E 10/543* (2013.01); *Y02P 70/521* (2015.11)

(58) Field of Classification Search
USPC .......................................................... 427/74
See application file for complete search history.

(56) References Cited

U.S. PATENT DOCUMENTS 2,384,500 A 9/1945 Stoll
3,057,792 A 10/1962 Fröhlich
(Continued)

FOREIGN PATENT DOCUMENTS

CN 101292058 A 10/2008
EP 0853345 A1 7/1998
(Continued)

OTHER PUBLICATIONS

Chinese First Office Action, Application No. 201110112892.0 dated Feb. 26, 2014.
(Continued)

*Primary Examiner* — Austin Murata
(74) *Attorney, Agent, or Firm* — MacMillan, Sobanski & Todd, LLC

(57) ABSTRACT

A method for vapor deposition of a sublimated source material, such as CdTe, onto substrates in a continuous, non-stop manner through the apparatus is provided. The sublimated source material moves through a distribution plate and deposits onto the upper surface of the substrates as they are conveyed through the deposition area. The substrates move into and out of the deposition area through entry and exit slots that are defined by transversely extending entrance and exit seals. The seals are disposed at a gap distance above the upper surface of the substrates that is less than the distance or spacing between the upper surface of the substrates and the distribution plate. The seals have a ratio of longitudinal length (in the direction of conveyance of the substrates) to gap distance of from about 10:1 to about 100:1.

7 Claims, 5 Drawing Sheets

(51) Int. Cl.
*C23C 14/24* (2006.01)
*C23C 14/56* (2006.01)

(56) References Cited

U.S. PATENT DOCUMENTS

| | | |
|---|---|---|
| 3,667,626 A | 6/1972 | Torelli et al. |
| 4,401,052 A | 8/1983 | Baron et al. |
| 4,664,951 A | 5/1987 | Doehler |
| 4,770,291 A | 9/1988 | Shaw |
| 4,797,054 A | 1/1989 | Arii |
| 5,102,279 A | 4/1992 | Ezaki et al. |
| 5,248,349 A | 9/1993 | Foote et al. |
| 5,304,499 A | 4/1994 | Bonnet et al. |
| 5,366,764 A | 11/1994 | Sunthankar |
| 5,372,646 A | 12/1994 | Foote et al. |
| 5,470,397 A | 11/1995 | Foote et al. |
| 5,536,333 A | 7/1996 | Foote et al. |
| 5,712,187 A | 1/1998 | Li et al. |
| 5,772,715 A | 6/1998 | McMaster et al. |
| 5,945,163 A | 8/1999 | Powell et al. |
| 5,994,642 A | 11/1999 | Higuchi et al. |
| 6,037,241 A | 3/2000 | Powell et al. |
| 6,080,240 A | 6/2000 | Uchida et al. |
| 6,310,281 B1 | 10/2001 | Wendt et al. |
| 6,423,565 B1 | 7/2002 | Barth et al. |
| 6,444,043 B1 | 9/2002 | Gegenwart et al. |
| 6,719,848 B2 | 4/2004 | Faykosh et al. |
| 7,156,960 B2 | 1/2007 | Vanden Brande et al. |
| 7,194,197 B1 | 3/2007 | Wendt et al. |
| 7,211,462 B2 | 5/2007 | Romeo et al. |
| 7,220,321 B2 | 5/2007 | Barth et al. |
| 2002/0117199 A1 | 8/2002 | Oswald |
| 2003/0044539 A1 | 3/2003 | Oswald |
| 2004/0191950 A1* | 9/2004 | Nakamura et al. ............... 438/98 |
| 2005/0158891 A1* | 7/2005 | Barth et al. ..................... 438/22 |
| 2006/0060447 A1* | 3/2006 | Ramaker et al. ......... 198/370.02 |
| 2008/0073559 A1 | 3/2008 | Horsky et al. |
| 2009/0194165 A1 | 8/2009 | Murphy et al. |

FOREIGN PATENT DOCUMENTS

| | | |
|---|---|---|
| JP | 4006273 | 1/1992 |
| JP | 2010040988 | 2/2010 |

OTHER PUBLICATIONS

Chinese Second Office Action, Application No. 201110112892.0 dated Oct. 23, 2014.

EP Search Report issued in connection with corresponding EP Patent Application No. 11163129.7 filed on Apr. 20, 2011.

\* cited by examiner

PROCESS FOR CONTINUOUS DEPOSITION OF A SUBLIMATED SOURCE MATERIAL TO FORM A THIN FILM LAYER ON A SUBSTRATE

PRIORITY INFORMATION

The present application claims priority to and is a divisional application of U.S. patent application Ser. No. 12/765,316 titled "Seal Configuration for a System for Continuous Deposition of a Thin Film Layer on a Substrate" of Reed, et al. filed on Apr. 22, 2010, which is incorporated by reference herein.

FIELD OF THE INVENTION

The subject matter disclosed herein relates generally to the field of thin film deposition systems wherein a thin film layer, such as a semiconductor material layer, is deposited on a substrate. More particularly, the disclosed subject matter is related to a system for depositing a thin film layer of a photoreactive material on a glass substrate in the formation of photovoltaic (PV) modules.

BACKGROUND OF THE INVENTION

Thin film photovoltaic (PV) modules (also referred to as "solar panels" or "solar modules") based on cadmium telluride (CdTe) paired with cadmium sulfide (CdS) as the photoreactive components are gaining wide acceptance and interest in the industry. CdTe is a semiconductor material having characteristics particularly suited for conversion of solar energy (sunlight) to electricity. For example, CdTe has an energy bandgap of 1.45 eV, which enables it to convert more energy from the solar spectrum as compared to lower bandgap (1.1 eV) semiconductor materials historically used in solar cell applications. Also, CdTe converts energy more efficiently in lower or diffuse light conditions as compared to the lower bandgap materials and, thus, has a longer effective conversion time over the course of a day or in low-light (e.g., cloudy) conditions as compared to other conventional materials.

Solar energy systems using CdTe PV modules are generally recognized as the most cost efficient of the commercially available systems in terms of cost per watt of power generated. However, the advantages of CdTe not withstanding, sustainable commercial exploitation and acceptance of solar power as a supplemental or primary source of industrial or residential power depends on the ability to produce efficient PV modules on a large scale and in a cost effective manner.

Vapor deposition systems for processing individual glass sheets in the formation of PV modules are known. For all such systems, a vacuum lock or seal configuration must be provided at the ingress and egress points for the glass substrate as it moves into and out of the deposition chamber. For example, it is known to use vacuum locks (also referred to as "load locks") for indexing discrete glass sheets into and out of a deposition chamber, as described in U.S. Pat. No. 4,797,054. These vacuum locks essentially seal the glass sheet within the chamber during the static deposition process and are not suitable for continuous conveyance of discrete glass sheets through a deposition chamber.

U.S. Pat. No. 5,772,715 describes a deposition system wherein multiple vacuum chamber slit seals are provided at the ingress and egress locations. These seals are relatively complicated and involve establishing three separate vacuum stages drawn by separate vacuum pumps. Although the U.S. '715 patent describes that the seals are suitable for processing either discrete glass sheets or a continuous glass ribbon, they are mechanically quite complex and would add significantly to the manufacturing costs of PV modules.

CSS (Close Space Sublimation) is a known commercial vapor deposition process for production of CdTe modules. Reference is made, for example, to U.S. Pat. No. 6,444,043 and U.S. Pat. No. 6,423,565. While there are advantages to the CSS process, the system is inherently a batch process wherein the glass substrates are indexed into a vapor deposition chamber, held in the chamber for a finite period of time in which the film layer is formed, and subsequently indexed out of the chamber. The U.S. '565 patent cited above describes a system wherein air-to-vacuum-to-air (AVA) openings are provided for indexing the glass substrates into and out of a vacuum chamber, which includes a processing station for vapor deposition of a film on the glass substrates. The patent purports to provide a "novel sealing relationship" between the deposition station (a heated "block" having a pocket in which the source material is contained) and the glass substrate wherein a relatively tight tolerance is maintained between the glass and the top of the block on the order of 0.001 in. to 0.018 in. This configuration results in the glass substrate essentially acting as a shutter across the top of the block pocket. This shutter-type of seal configuration wherein the glass substrate essentially seals the deposition chamber is not suitable for a continuous deposition process wherein discrete glass sheets are continuously conveyed through a vacuum deposition chamber.

Accordingly, there exists an ongoing need in the industry for a seal configuration that is particularly suited for large scale and efficient production of PV modules, particularly CdTe based modules, by continuous conveyance of a plurality of discrete substrates through a vapor deposition chamber.

BRIEF DESCRIPTION OF THE INVENTION

Aspects and advantages of the invention will be set forth in part in the following description, or may be obvious from the description, or may be learned through practice of the invention.

In accordance with an embodiment of the invention, an apparatus is provided for vapor deposition of a sublimated source material, such as CdTe, as a thin film on discrete photovoltaic (PV) module substrates that are conveyed in a continuous, non-stop manner through the apparatus. The apparatus includes a deposition head configured for receipt and sublimation of the source material. The deposition head has a distribution plate at a defined distance above a horizontal conveyance plane of an upper surface of the substrates conveyed through a deposition area within the apparatus. The sublimated source material moves through the distribution plate and deposits onto the upper surface of the substrates as they are conveyed through the deposition area. The substrates move into and out of the deposition area through entry and exit slots that are defined by transversely extending entrance and exit seals. At least one of these seals is disposed at a gap distance above the upper surface of the substrates that is less than the distance or spacing between the upper surface of the substrates and the distribution plate. The seal has a ratio of longitudinal length (in the direction of conveyance of the substrates) to gap distance of from about 10:1 to about 100:1. This unique seal configuration ensures that the sublimated source material is contained within the deposition area yet does not inhibit the continuous movement of substrates into and out of the deposition area. Both the entry and exit seals may have this configuration.

In a unique embodiment, the gap distance between the upper surface of the substrates and the seals is between about 1/16 or about 0.06 of an inch (about 1.59 mm.) to about 3/16 or about 0.18 of an inch (about 4.76 mm.).

In particular embodiments, the seals may have a flat, continuous surface over the longitudinal length thereof and may be defined, for example, by structure of the deposition head at opposite longitudinal ends of the deposition area. This structure may be heated to a temperature greater than that of the substrates conveyed through the deposition area.

Variations and modifications to the apparatus discussed above are within the scope and spirit of the invention and may be further described herein.

In accordance with another embodiment of the present invention, a process is provided for vapor deposition of a thin film layer, such as a CdTe film layer, on photovoltaic (PV) module substrates. The process includes supplying source material to a deposition head and heating the source material to sublimate the source material. A plurality of the PV module substrates are conveyed in a continuous, non-stop manner below the deposition head. The sublimated source material moves downwardly within the deposition head and deposits on the upper surface of the substrates in a deposition area. The substrates are moved through entrance and exit slots at opposite longitudinal ends of the deposition area, with the entrance and exit slots defined by transversely extending entrance and exit seals disposed at a gap distance above the upper surface of the substrates and having a ratio of longitudinal length (in direction of conveyance of the substrates) to gap distance of from about 10:1 to about 100:1.

In a particular embodiment of the process, the source material is heated within the deposition head with a heat source member and the sublimated source material passes through the heat source member before depositing onto the upper surface of the substrates. The substrates may be conveyed at a controlled constant linear speed such that leading and trailing sections of each substrate in a conveyance direction are exposed to the same vapor deposition conditions within the deposition head to achieve a substantially uniform thickness of the thin film layer on the upper surface of the substrates.

Variations and modifications to the embodiments of the process discussed above are within the scope and spirit of the invention and may be further described herein.

These and other features, aspects and advantages of the present invention will become better understood with reference to the following description and appended claims.

BRIEF DESCRIPTION OF THE DRAWING

A full and enabling disclosure of the present invention, including the best mode thereof, is set forth in the specification, which makes reference to the appended drawings, in which.

DETAILED DESCRIPTION OF THE INVENTION

Figure 1:
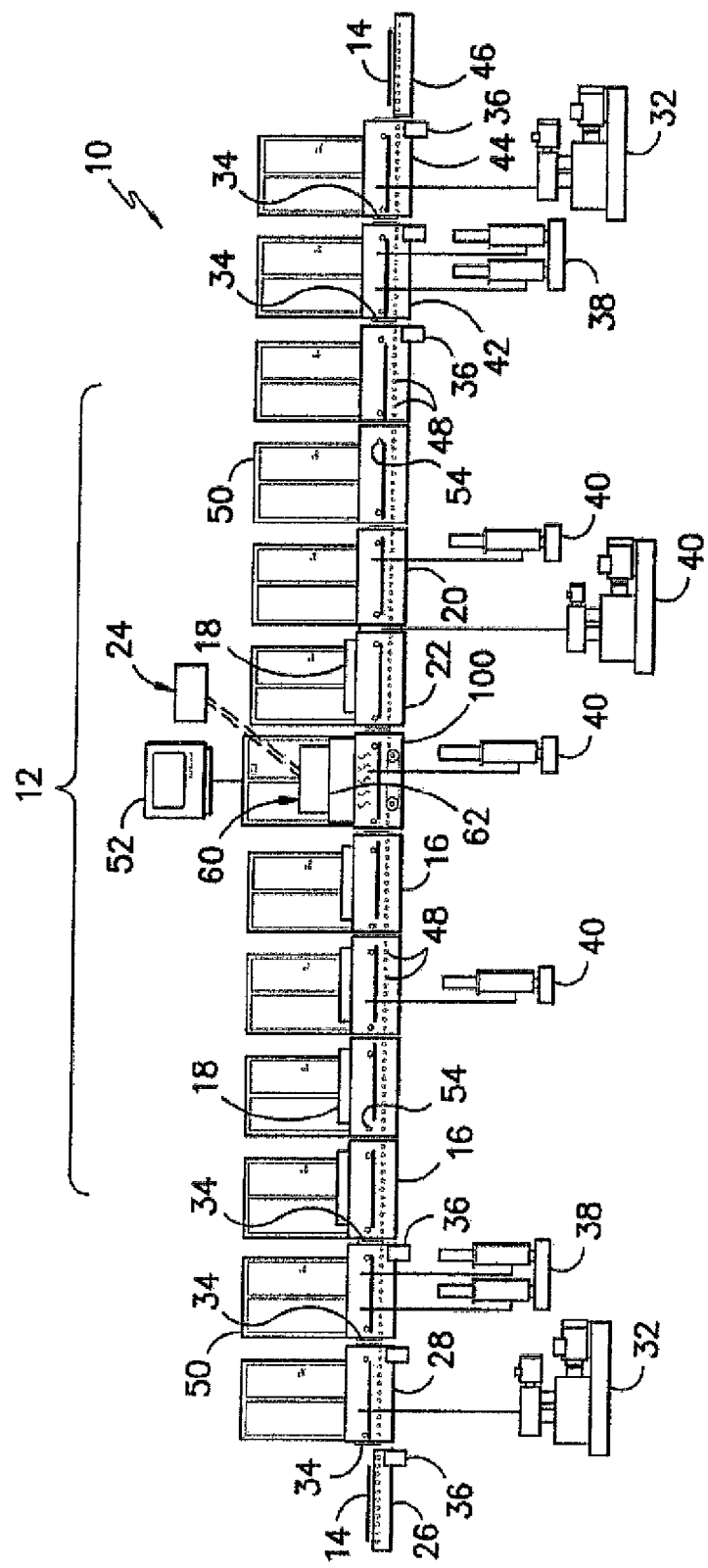
FIG. 1 is a plan view of an embodiment of a system incorporating a vapor deposition apparatus in accordance with aspects of the invention.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention encompass such modifications and variations as come within the scope of the appended claims and their equivalents.

FIG. 1 illustrates an embodiment of a vapor deposition system 10 that may incorporate an apparatus in accordance with aspects of the invention. The system 10 is configured for deposition of a thin film layer on a photovoltaic (PV) module substrate 14 (referred to hereafter as "substrate"). The thin film may be, for example, a film layer of cadmium telluride (CdTe). Although the invention is not limited to any particular film thickness, as mentioned, it is generally recognized in the art that a "thin" film layer on a PV module substrate is generally less than about 10 microns (μm). It should be appreciated that the present apparatus and process are not limited to use in the system 10 illustrated in FIG. 1, but may be incorporated into any suitable processing line configured for vapor deposition of a thin film layer onto a PV module substrate 14.

For reference and an understanding of an environment in which the present apparatus may be used, the system 10 of FIG. 1 is described below, followed by a detailed description of the unique features of the present apparatus.

Referring to FIG. 1, the exemplary system 10 includes a vacuum chamber 12 defined by a plurality of interconnected modules. Any combination of initial ("rough") and high ("fine") vacuum pumps 40 may be configured with the modules to draw and maintain a vacuum within the chamber 12. A plurality of interconnected heater modules 16 define a pre-heat section of the vacuum chamber 12 through which the substrates 14 are conveyed and heated to a desired temperature before being conveyed into a vapor deposition apparatus 60. Each of the modules 16 may include a plurality of independently controlled heaters 18, with the heaters defining a plurality of different heat zones. A particular heat zone may include more than one heater 18.

The vacuum chamber 12 also includes a plurality of interconnected cool-down modules 20 within the vacuum chamber 12 downstream of the vapor deposition apparatus 60. The cool-down modules 20 define a cool-down section within the vacuum chamber 12 in which the substrates 14 having the thin film of sublimed source material deposited thereon are allowed to cool at a controlled cool-down rate prior to the substrates 14 being removed from the system 10. Each of the modules 20 may include a forced cooling system wherein a cooling medium, such as chilled water, refrigerant, or other medium is pumped through cooling coils configured with the modules 20.

In the illustrated embodiment of system 10, at least one post-heat module 22 is located immediately downstream of the vapor deposition apparatus 60 and before the cool-down modules 20. The post-heat module 22 maintains a controlled heating profile of the substrate 14 until the entire substrate is moved out of the vapor deposition apparatus 60 to prevent damage to the substrate, such as warping or breaking caused by uncontrolled or drastic thermal stresses. If the leading section of the substrate 14 were allowed to cool at an excessive rate as it exited the apparatus 60, a potentially damaging temperature gradient would be generated longitudinally along the substrate 14. This condition could result in breaking, cracking, or warping of the substrate from thermal stress.

As diagrammatically illustrated in FIG. 1, a feed device 24 is configured with the vapor deposition apparatus 60 to supply source material, such as granular CdTe. Preferably, the feed device 24 is configured so as to supply the source material without interrupting the continuous vapor deposition process within the apparatus 60 or conveyance of the substrates 14 through the apparatus 60.

Still referring to FIG. 1, the individual substrates 14 are initially placed onto a load conveyor 26, and are subsequently moved into an entry vacuum lock station that includes a load module 28 and a buffer module 30. A "rough" (i.e., initial) vacuum pump 32 is configured with the load module 28 to drawn an initial vacuum, and a "fine" (i.e., high) vacuum pump 38 is configured with the buffer module 30 to increase the vacuum in the buffer module 30 to essentially the vacuum within the vacuum chamber 12. Valves 34 (e.g., gate-type slit valves or rotary-type flapper valves) are operably disposed between the load conveyor 26 and the load module 28, between the load module 28 and the buffer module 30, and between the buffer module 30 and the vacuum chamber 12. These valves 34 are sequentially actuated by a motor or other type of actuating mechanism 36 in order to introduce the substrates 14 into the vacuum chamber 12 in a step-wise manner without affecting the vacuum within the chamber 12.

An exit vacuum lock station is configured downstream of the last cool-down module 20, and operates essentially in reverse of the entry vacuum lock station described above. For example, the exit vacuum lock station may include an exit buffer module 42 and a downstream exit lock module 44. Sequentially operated slide valves 34 are disposed between the buffer module 42 and the last one of the cool-down modules 20, between the buffer module 42 and the exit lock module 44, and between the exit lock module 44 and an exit conveyor 46. A fine vacuum pump 38 is configured with the exit buffer module 42, and a rough vacuum pump 32 is configured with the exit lock module 44. The pumps 32, 38 and valves 34 are sequentially operated to move the substrates 14 out of the vacuum chamber 12 in a step-wise fashion without loss of vacuum condition within the vacuum chamber 12.

The system 10 also includes a conveyor system configured to move the substrates 14 into, through, and out of the vacuum chamber 12. In the illustrated embodiment, this conveyor system includes a plurality of individually controlled conveyors 48, with each of the various modules including one of the conveyors 48. It should be appreciated that the type or configuration of the conveyors 48 in the various modules may vary. In the illustrated embodiment, the conveyors 48 are roller conveyors having driven rollers that are controlled so as to achieve a desired conveyance rate of the substrates 14 through the respective module and the system 10 overall. The conveyor in the vapor deposition apparatus 60 may have a different configuration, as discussed in greater detail below.

As described, each of the various modules and respective conveyors in the system 10 are independently controlled to perform a particular function. For such control, each of the individual modules may have an associated independent controller 50 configured therewith to control the individual functions of the respective module. The plurality of controllers 50 may, in turn, be in communication with a central system controller 52, as illustrated in FIG. 1. The central system controller 52 can monitor and control (via the independent controllers 50) the functions of any one of the modules so as to achieve an overall desired heat-up rate, deposition rate, cool-down rate, and so forth, in processing of the substrates 14 through the system 10.

Referring to FIG. 1, for independent control of the individual respective conveyors 48, each of the modules may include any manner of active or passive sensor 54 that detects the presence of the substrates 14 as they are conveyed through the module. The sensors 54 are in communication with the respective module controller 50, which is in turn in communication with the central controller 52. In this manner, the individual respective conveyor 48 may be controlled to ensure that a proper spacing between the substrates 14 is maintained and that the substrates 14 are conveyed at the desired constant conveyance rate through the vacuum chamber 12.

An exemplary vapor deposition apparatus 60 is depicted in FIG. 1 as a module. This module may take on various configurations and operating principles within the scope and spirit of the invention, and is generally configured for vapor deposition of a sublimated source material, such as CdTe, as a thin film on the PV module substrates 14. In the embodiment of the system 10 illustrated in FIG. 1, the apparatus 60 is a module that includes a casing 95 (FIG. 2) in which the internal components are contained, including a deposition head 62 mounted above a conveyor assembly 100. It should be appreciated that the casing 95 may include any manner of internal structure 97 that may support the conveyor assembly 100.

Figure 2:
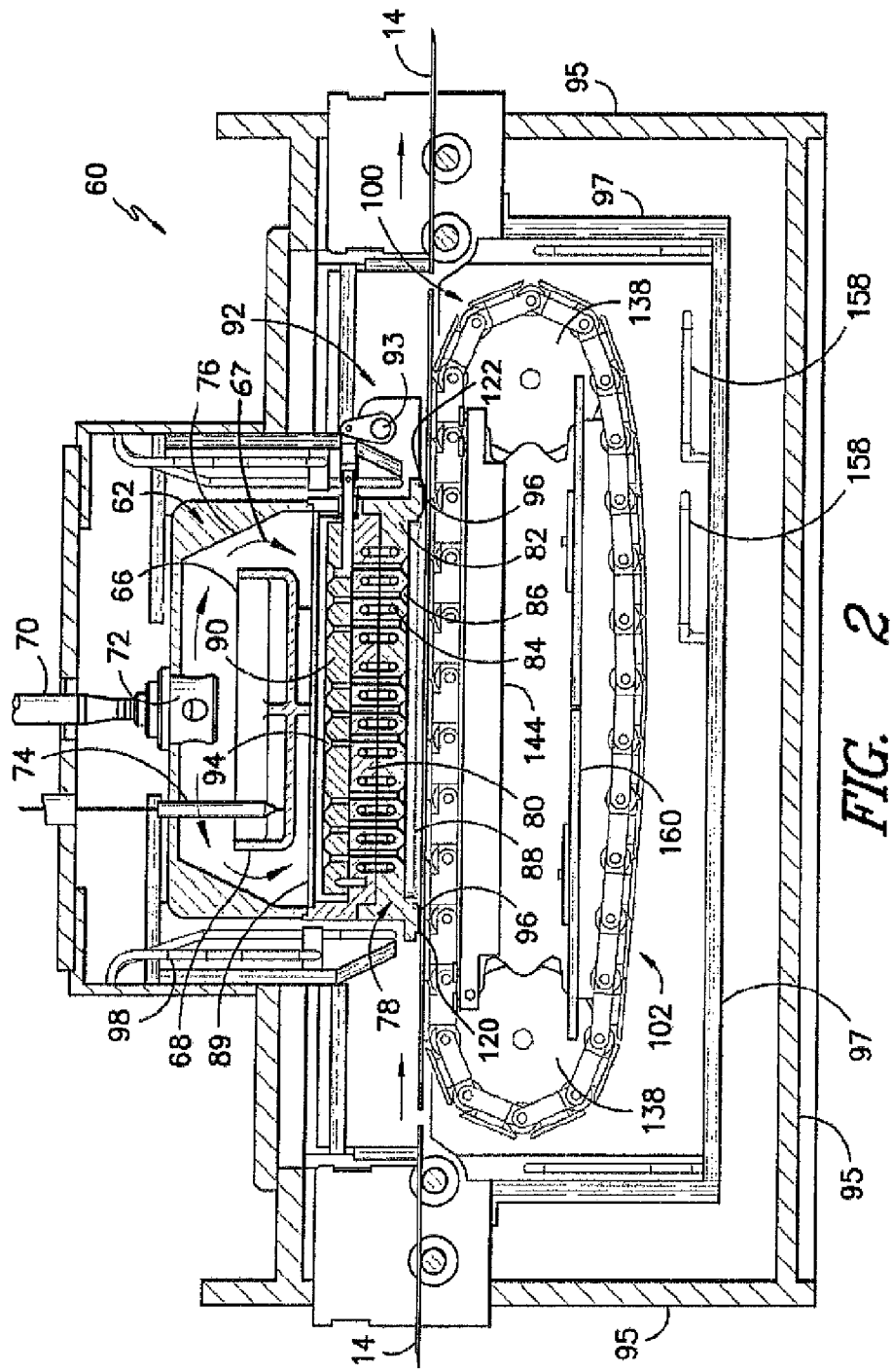
FIG. 2 is a cut-away side view of an embodiment of a vapor deposition in accordance with aspects of the invention.
Figure 4:
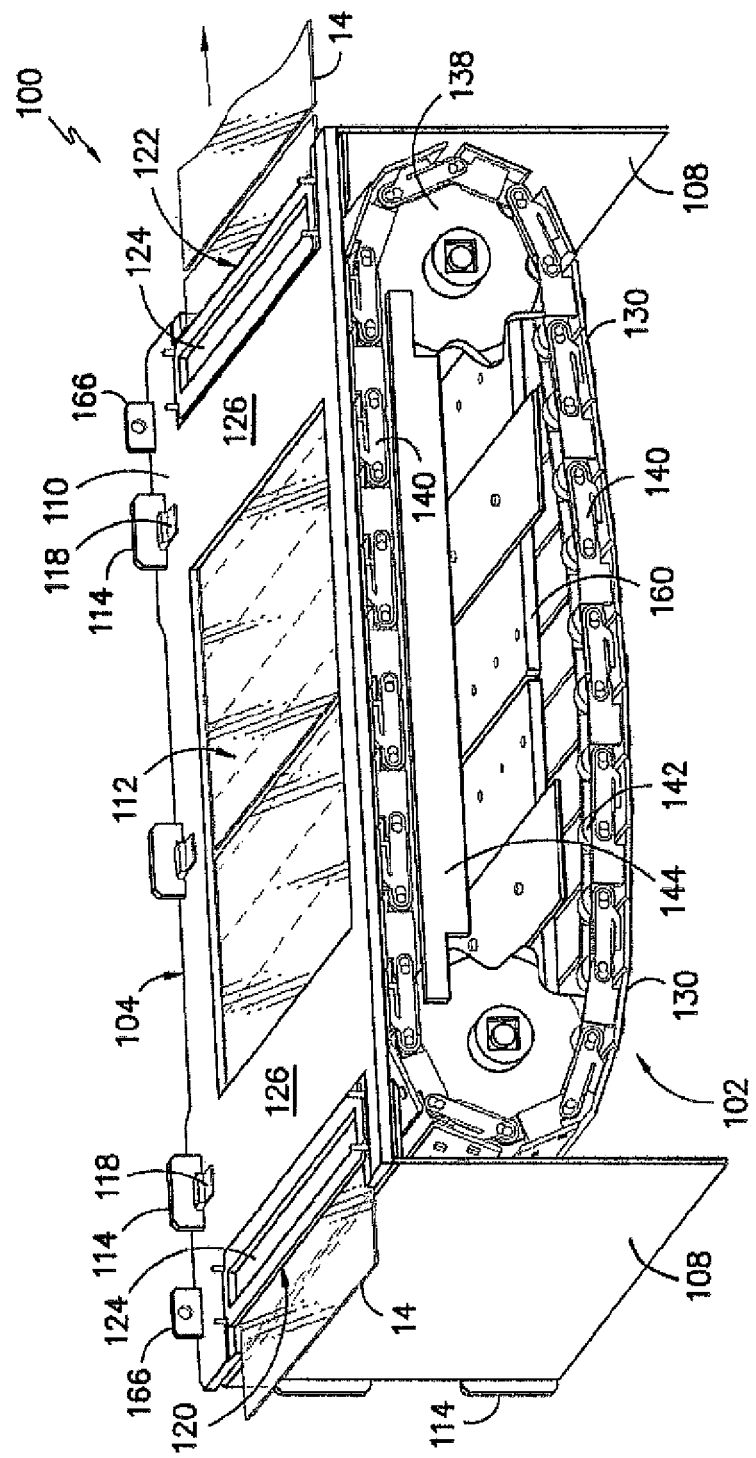
FIG. 4 is a perspective view of components of an alternate embodiment of a vapor deposition apparatus in accordance with aspects of the invention.

Various embodiments of a conveyor assembly 100 may be utilized. In FIG. 2, the conveyor assembly 100 may be modular in construction and include a housing 104, as depicted in FIG. 4. The housing 104 has been removed in the view of FIG. 2 for sake of clarity and explanation. Components of the conveyor assembly 100 are discussed below.

Referring to FIG. 2, the module 60 is depicted in greater detail. The vacuum deposition head 62 defines an interior space in which a receptacle 66 is configured for receipt of a granular source material (not shown). As mentioned, the granular source material may be supplied by a feed device or system 24 (FIG. 1) via a feed tube 70. The feed tube 70 is connected to a distributor 72 disposed in an opening in a top wall of the deposition head 62. The distributor 72 includes a plurality of discharge ports that are configured to evenly distribute the granular source material into the receptacle 66. A thermocouple 74 is operationally disposed through the top wall of the deposition head 62 to monitor temperature within the head chamber adjacent or in the receptacle 66.

The feed system 24 is designed to continuously supply the apparatus 60 with source material in a manner so as not to interrupt the vapor deposition process or non-stop conveyance of the substrates 14 through the module 60. The feed system 24 is not a limiting factor of the invention, and any suitable feed system may be devised to supply the source material into the apparatus 60. For example, the feed system 24 may include sequentially operated vacuum locks wherein an external source of the material is introduced as metered doses in a step-wise manner through the vacuum locks and into the receptacle 66 within the vapor deposition apparatus 60. The supply of source material is considered "continuous" in that the vapor deposition process need not be stopped or halted in order to re-supply the apparatus 60 with source material. So long as the external supply is maintained, the feed system 24 will continuously supply batches or metered doses of the material into the vapor deposition apparatus 60.

The receptacle 66 has a shape and configuration such that end walls 68 of the receptacle 66 are spaced from end walls 76 of the deposition head 62. The side alls of the receptacle 66 lie adjacent to and in close proximity to the side walls of the deposition head 62 (not visible in the view of FIG. 2) so that very little clearance exists between the respective side walls. With this configuration, sublimated source material will flow out of the receptacle 66 as leading and trailing curtains of vapor 67 over the transversely extending end walls 68, as indicated by the flow arrows in FIG. 2. Very little of the sublimated source material will flow over the side walls of the receptacle 66.

A heated distribution manifold 78 is disposed below the receptacle 66, and may have a clam-shell configuration that includes an upper shell member 80 and a lower shell member 82. The mated shell members 80, 82 define cavities in which heater elements 84 are disposed. The heater elements 84 heat the distribution manifold 78 to a degree sufficient for indirectly heating the source material within the receptacle 66 to cause sublimation of the source material. The heat generated by the distribution manifold 78 also aids in preventing the sublimated source material from plating out onto components of the deposition head 62. Additional heater elements 98 may also be disposed within the deposition head 62 for this purpose. Desirably, the coolest component within the deposition head 62 is the upper surface of the substrates 14 conveyed therethrough so that the sublimated source material is ensured to plate primarily on the substrates.

The embodiment of FIG. 2 includes a movable shutter plate 90 disposed above the distribution manifold 78. This shutter plate 90 includes a plurality of passages 94 defined therethrough that align with the passages 86 in the distribution manifold 78 in a first operational position of the shutter plate 90 (not depicted in FIG. 2) such that the sublimated source material is free to flow through the shutter plate 90 and through the distribution manifold 78 for subsequent distribution through the plate 88. The shutter plate 90 is movable to a second operational position (depicted in FIG. 2) wherein the passages 94 are misaligned with the passages 86 in the distribution manifold 78. In this configuration, the sublimated source material is blocked from passing through the distribution manifold 78, and is essentially contained within the interior volume of the deposition head 62. Any suitable actuation mechanism 92 may be configured for moving the shutter plate 90 between the first and second operational positions. In the illustrated embodiment, the actuation mechanism 92 includes a rod 93 and any manner of suitable linkage that connects the rod 93 to the shutter plate 90. The rod 93 is externally rotated by any manner of mechanism located externally of the deposition head 62. The shutter plate 90 is particularly beneficial in that the sublimated source material can be quickly and easily contained within the deposition head 62 and prevented from passing through to the deposition area above the substrates 14 or conveyor assembly 100. This may be desired, for example, during start up of the system 10 while the concentration of vapors within the deposition head chamber builds to a sufficient degree to start the deposition process. Likewise, during shutdown of the system, it may be desired to maintain the sublimated source material within the deposition head 62 to prevent the material from condensing (also referred to as plating) on the conveyor or other components of the apparatus 60.

A distribution plate 88 is disposed below the manifold 78 at a defined distance above a horizontal plane of the upper surface of an underlying substrate 14, as depicted in FIG. 2. A deposition area 112 (FIGS. 3 and 5) is thus defined by the space between the distribution plate 88 and the substrates 14.

The distribution plate 88 includes a pattern of holes or passages therethrough that further distribute the sublimated source material passing through the distribution manifold 78 throughout the deposition area 112. The passages 86 in the distribution manifold 78 and the holes in the distribution plate 88 ensure a relatively uniform distribution of the sublimated source material in the transverse aspect of the vapor deposition apparatus 60. So long as the uniform transverse aspect of the vapor is maintained, a relatively uniform thin film layer is deposited onto the upper surface of the substrates 14.

As previously mentioned, a significant portion of the sublimated source material will flow out of the receptacle 66 as transversely extending leading and trailing curtains of vapor. Although these curtains of vapor will diffuse to some extent in the longitudinal direction (direction of conveyance of the substrates) prior to passing through the distribution plate 88, it should be appreciated that it is unlikely that a uniform distribution of the sublimated source material in the longitudinal direction will be achieved. In other words, within the deposition area 112, more of the sublimated source material will be distributed through the longitudinal end sections of the distribution plate 88 as compared to the middle portion of the distribution plate.

The individual substrates 14 are conveyed through the vapor deposition module 60 at a controlled constant linear speed. In other words, the substrates 14 are not stopped or held within the module 60, but move continuously through the module at a controlled linear rate. The conveyance rate of the substrates 14 may be in the range of, for example, about 10 mm/sec to about 40 mm/sec. In a particular embodiment, this rate may be, for example, about 20 mm/sec. In this manner, the leading and trailing sections of the substrates 14 in the conveyance direction are exposed to the same vapor deposition conditions within the vapor deposition module 60. All regions of the top surface of the substrates 14 are exposed to the same vapor conditions so as to achieve a substantially uniform thickness of the thin film layer of sublimated source material on the upper surface of the substrates 14.

As illustrated in FIG. 2, it may be desired to include a debris shield 89 between the receptacle 66 and the distribution manifold 78. This shield 89 may include relatively large holes defined therethrough (as compared to the distribution plate 88) and serves to retain any granular or particulate source material from passing through and potentially interfering with operation of the other components of the deposition head 62. In another embodiment, the holes may be very small, or the shield may be a mesh screen, so as to prevent even very small granules or particles of solid source material from passing through the shield.

Figure 3:
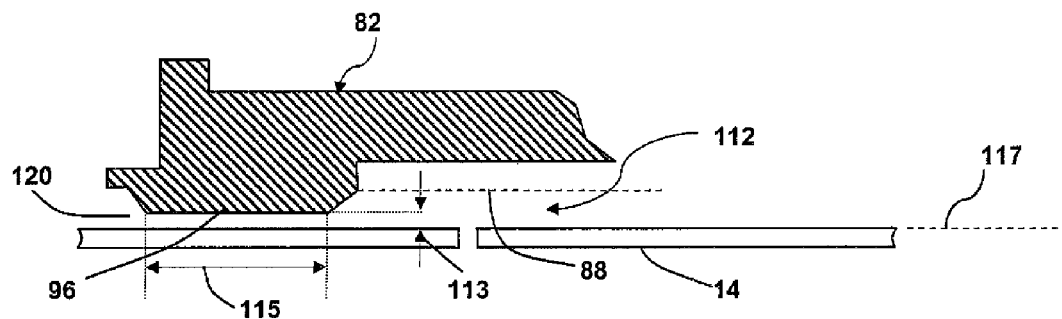
FIG. 3 is a diagrammatic side view of an embodiment of a seal configuration that may be used in the embodiment of FIG. 2.

The vapor deposition apparatus 60 includes an entrance slot 120 and an exit slot 122 at opposite longitudinal ends of the deposition area 112 (FIG. 3). The slots 120, 122 may define the longitudinal boundaries of the deposition area 112, as in the embodiment of FIG. 2, or may be spaced from the boundaries of the deposition area 112, as discussed more fully below with respect to the embodiment of FIGS. 4 and 5. Although it is within the scope and spirit of the invention that only one of the slots 120, 122 be configured as described herein, it is preferable is both slots are configured with the unique seal arrangement. In this regard, the entrance and exit slots 120, 122 are defined by transversely extending entrance and exit seal structures 96. In the embodiment of FIGS. 2 and 3, the seal structures are defined by transversely extending shelf or ridge portions of the lower shell member 82 of the heated distribution manifold 78 members. It should be readily appreciated that the seal structures 96 may be defined by any suitable device or structure, and that the seals are not limited to the structure depicted and described herein.

Referring to FIG. 3, the seal structures 96 have a longitudinal length 115 (in the direction of conveyance of the substrates 114) and are disposed at a gap distance 113 above the upper surface of the substrates 14 (which lie in a conveyance plane 117). The seal structures 96 are configured so as to have a ratio of longitudinal length 115 to gap distance 113 of from about 10:1 to about 100:1. The seals 96 help to maintain the sublimated source material in the deposition area 112 above the substrates 14. The unique ratio of length 115 to gap distance 113 prevents the sublimated source material from "leaking" out through the longitudinal entrance and exit slots 120, 122 yet provides sufficient clearance to ensure free and unimpeded conveyance of the substrates 14 through the slots.

In a unique embodiment, the gap distance 113 between the upper surface of the substrates 14 and the seals 96 is between about ¹⁄₁₆ or about 0.06 of an inch (about 1.59 mm.) to about ³⁄₁₆ or about 0.18 of an inch (about 4.76 mm.).

In particular embodiments, the seals 96 may have a flat, continuous surface over the longitudinal length 115 thereof and may be defined, for example, by structure of the deposition head 62 at opposite longitudinal ends of the deposition area 112, as illustrated in FIGS. 2 and 3. This structure 96 may be heated to a temperature greater than that of the substrates 14 conveyed through the deposition area 112 to ensure that the sublimated source material plates onto the substrates 14 and not onto the seal structures 96.

Figure 5:
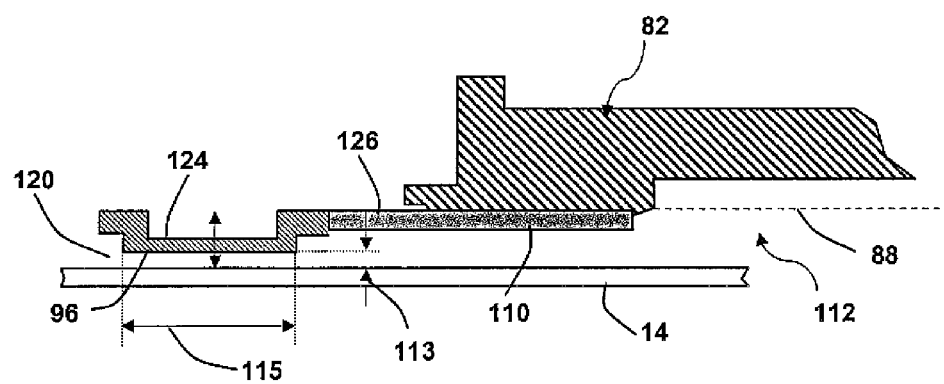
FIG. 5 is a diagrammatic side view of an embodiment of a seal configuration that may be used in the embodiment of FIG. 4; and, FIG. 6 is partial perspective view of an embodiment of a conveyor that may be used in a vapor deposition apparatus in accordance with aspects of the invention.

Referring to FIGS. 4 and 5, the housing 104 of the conveyor assembly 100 defines an enclosed interior volume (at least around the sides and top) in which a conveyor 102 is contained. The conveyor 102 is driven in an endless loop within the housing 104 around sprockets 138, with this endless loop having an upper leg that moves along a track 144 in a conveyance direction of the substrates 14 through the vapor deposition head 62, and a lower leg that moves in an opposite return direction. The housing 104 includes a top member 110 that defines the deposition area 112. This open deposition area 112 aligns with the vapor deposition head 62, particularly the distribution plate 88, as seen in FIG. 5, such that the upper surface of the substrates 14 are exposed to the distribution plate 88 in the open deposition area 112.

The conveyor 102 includes a plurality of interconnected slats 130. Each of the slats 130 has a respective flat planar outer surface 132 (FIG. 6) and transverse edges. Each of the slats 130 has a leading transverse edge profile 135 and a trailing transverse edge profile 136. In the illustrated embodiment, the trailing edge profile 136 is inclined or slanted with respect to vertical and the leading transverse edge profile 135 has a chamfered or double-angled profile, as is particularly seen in FIG. 6. The leading edge profile 135 cooperates with the trailing edge 136 of an adjacent slat 130 so as to define a tortuous non-vertical path through the adjacent slats 130 along the upper leg of the conveyor 102. This tortuous path inhibits sublimated source material from passing through the conveyor slats 130. Still referring to FIGS. 5 and 6, it can be seen that the adjacent slats 130 along the upper leg of the conveyor define a flat, planar surface whereby the outer surfaces 132 of the slats lie in a common horizontal plane and define an uninterrupted flat support surface for the substrates 14 conveyed through the apparatus 60. This flat support surface prevents bowing of the glass substrates 14. In addition, the flat conveyor surface, in combination with the transverse edge profiles of the slats 130 discussed above, prevent back side coating of the substrates 14 with sublimated source material.

Figure 6:
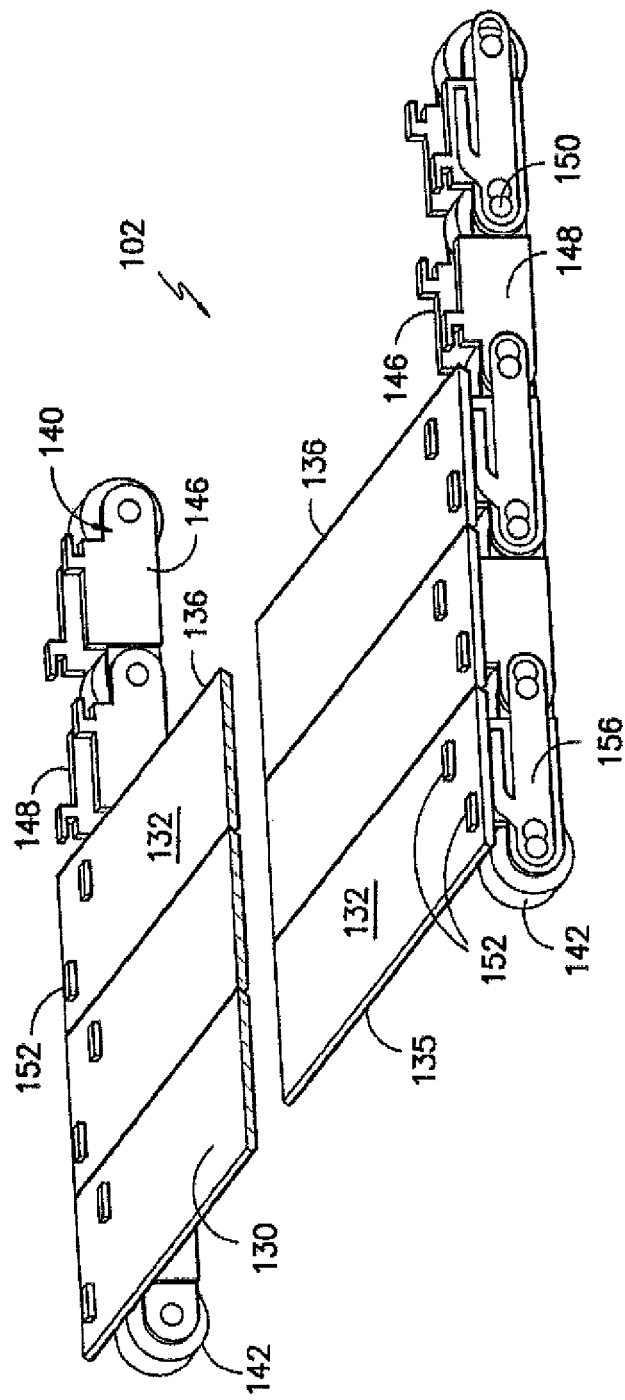

In a particular embodiment, the conveyor slats 130 are interconnected by link assemblies 140, as depicted in FIG. 6. These link assemblies 140 may take on various configurations. The link assemblies 140 include inner and outer link plates 146, 148. Rollers 142 are contained between the plates 146, 148 by respective axles 150. The axles 150 serve to interconnect adjacent inner and outer plates 146, 148 at the respective longitudinal ends thereof, and to also rotationally support the rollers 142 between the plates. Each of the inner and outer plates 146, 148 includes a tab 152 that extends through a slot in the slats 130. These tabs 152 have an undercut (seen in FIG. 5) such that after insertion of the tabs 152 through the slots, the plates 146, 148 are shifted relative to the tabs slats 130 to ensure that the slats 130 cannot be pulled from the plates 146, 148.

Referring to FIG. 6, one end of the axles 150 has an enlarged head that prevents the axles from being pulled through the plates 146, 148. The opposite end of the axles 150 protrudes through the outer plates 148. A clip 156 attaches to the end of the axles 150, and extends between two axles. Thus, the clip 156 has a longitudinal length that is essentially the same as one of the plates 146, 148, and does not inhibit travel of the link assemblies 140 around the sprockets 138.

Referring again to the housing construction 104 depicted in FIGS. 4 and 5, it can be seen that the open deposition area 112 in the top wall 110 has a transverse dimension (relative to the conveyance direction of the substrates 14) that is less than the transverse length of the underlying slats 130. In essence, the open deposition area 112 defines a "picture frame" around a completely flat, planar surface of the conveyor 102 in its upper leg of travel. The flat surface defined by the upper surfaces 132 of the slats is "uninterrupted" in that at no location within the open deposition area 112 can a vertical line be drawn through the surface. As described above, even at the transverse edges 135, 136 of adjacent slats 130, the transverse edge profiles define a non-vertical tortuous path that inhibits sublimated source material from passing therethrough.

Referring again to FIGS. 3 and 4, the housing 104 includes end walls 108 and side walls 106. The end walls 108, side walls 106, and top wall 110 are connected to each other by a tab and slot arrangement wherein tabs 114 on one wall engage within slots 116 on another wall. Pins 118 engage through the tabs 114 to retain the components in a connected assembly, as particularly illustrated in FIG. 4. This embodiment is particularly useful in that mechanical fasteners, such as screws, bolts, and the like, are not necessary to assemble the housing 104. The components of the housing 104 simply slide together and are pinned in position relative to each other. Assembly/disassembly of the housing 104 for maintenance or other procedures is a relatively easy process in this regard.

The housing 104, and conveyor 102 contained therein are configured for drop-in placement of the assembly 110 in the vapor deposition module 60. A plurality of braces 166 are attached to the side walls 106 and extend through slots in the top wall 110. These braces 166 define a plurality of lifting points for raising and lowering the assembly 100 into the casing 95 of the vapor deposition module 60. When maintenance is required, the entire conveyor assembly 100 is easily lifted from the module 60, and a spare assembly 100 is readily dropped in to replace the removed assembly 100. In this way, maintenance may be conducted on the removed assembly 100 while the processing line is returned to service. This keeps the vapor deposition line running in parallel with maintenance tasks. The conveyor assembly 100 sits on registration points within the casing 95 so that the different conveyor assemblies 100 are easily installed and removed.

Referring to FIGS. 4 and 5, the top wall 110 defines the entry slot 120 and the exit slot 122 for the substrates 14 that are conveyed under the vapor deposition head 62. Referring to FIG. 5, the seal structure 96 at these slots may be defined by the top wall 110, or other structures attached to the top wall 110. For example, in the illustrated embodiment, plate members 124 may be configured with the top member 110 for this purpose. These plate members 124 have a flat continuous surface with a longitudinal sealing length 115 and a gap distance 113 with the upper surface of the substrates 14. The plate members 124 may be adjustable relative to the top wall 110 (depicted by the double arrow in FIG. 5) so as to adjust the gap distance 113. The plate members 124 have the same ratio of length 115 to gap distance 113 as discussed above, and may have the same gap distances as discussed above.

Still referring to the embodiments of FIGS. 4 and 5, the top wall member 110 cooperates with the vapor deposition head 62 to define the deposition area 112 and provide additional sealing. For example, the vapor deposition head (e.g., the lower shell member 82) may engage directly against sealing surfaces 126 defined by the top wall 110. This sealing arrangement ensures that the sublimated source material that passes through the distribution plate 88 is maintained in the open deposition area 112 of the top member 110 and does not escape at the interface of the conveyor assembly 100 and vapor deposition head 62.

Referring again to FIG. 2, the conveyor assembly 100 may include any manner of additional functional components within the housing 104. For example, any number or configuration of heater elements 158 may be configured within the housing 104, or between the housing 104 and the casing 95. Any configuration of thermal shields 160 may also be contained within the housing 104.

The present invention also encompasses various process embodiments for vapor deposition of a thin film layer on a photovoltaic (PV) module substrate. The processes may be practiced with the various system embodiments described above or by any other configuration of suitable system components. It should thus be appreciated that the process embodiments according to the invention are not limited to the system configuration described herein.

In a particular embodiment, the process includes supplying source material to a deposition head and heating the source material so as to sublimate the source material. A plurality of the PV module substrates are conveyed in a continuous, non-stop manner below the deposition head. The sublimated source material moves downwardly within the deposition head and deposits on the upper surface of the substrates in a deposition area. The substrates are moved through entrance and exit slots at opposite longitudinal ends of the deposition area, with the entrance and exit slots defined by transversely extending entrance and exit seals disposed at a gap distance above the upper surface of the substrates and having a ratio of longitudinal length (in direction of conveyance of the substrates) to gap distance of from about 10:1 to about 100:1.

In a particular embodiment of the process, the source material is heated within the deposition head with a heat source member and the sublimated source material passes through the heat source member before depositing onto the upper surface of the substrates. The substrates may be conveyed at a controlled constant linear speed such that leading and trailing sections of each substrate in a conveyance direction are exposed to the same vapor deposition conditions within the deposition head to achieve a substantially uniform thickness of the thin film layer on the upper surface of the substrates.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A process for vapor deposition of a sublimated source material to form thin film on photovoltaic (PV) module substrates, the process comprising:
supplying source material to a deposition head;
heating the source material so as to sublimate the source material;
conveying a plurality of the PV module substrates in a continuous non-stop manner below the deposition head;
directing the sublimated source material downwardly within the deposition head so that the sublimated source material deposits on an upper surface of the substrates in a deposition area; and
moving the substrates through entrance and exit slots at opposite longitudinal ends of the deposition area, the entrance and exit slots defined by transversely extending entrance and exit seals disposed at a gap distance above the upper surface of the substrates and having a ratio of longitudinal length to gap distance of from about 10:1 to about 100:1;
wherein each of said entrance and exit seals comprise a flat, continuous surface over said longitudinal length thereof;
wherein said entrance and exit seals are defined by a heated structure of said deposition head at opposite longitudinal ends of said deposition area, said structure heated to a temperature greater than that of the substrates conveyed through said deposition area;
wherein said deposition head further comprises a receptacle configured for receipt of the source material and a heated distribution manifold disposed below said receptacle, said heated distribution manifold configured to heat said receptacle to a degree sufficient to sublimate source material within said receptacle, said entrance and exit seals defined by transversely extends members of said distribution manifold;
wherein said distribution manifold defines a plurality of passages to allow passage of sublimated source material therethrough, and internal heating elements arranged between said passages in said distribution manifold; and
wherein said deposition head further comprises a movable shutter plate disposed above said distribution manifold, said shutter plate comprising a plurality of passages therethrough that align with said passages in said distribution manifold in a first position of said shutter plate to allow passage of sublimated source material through said distribution manifold, said shutter plate movable to a second position wherein said shutter plate blocks said passages in said distribution manifold to flow of sublimated material therethrough.

2. The process as in claim 1, wherein said distribution manifold comprises an upper shell member and a lower shell member, said shell members defining internal cavities in which said heating elements are disposed, said entrance and exit seals defined by members of said lower shell member.

3. A method of controlling vapor deposition of a sublimated source material in a process to form a thin film on photovoltaic (PV) module substrates, the method comprising:

supplying a source material to a deposition head receptacle disposed above a deposition area;

heating the source material so as to sublimate the source material;

positioning a movable shutter plate relative to a distribution manifold, wherein the distribution manifold comprises a plurality of passages configured to convey sublimated source material between the deposition head receptacle and the deposition area, wherein the shutter plate is disposed immediately adjacent the distribution manifold, wherein the shutter plate comprises a plurality of passages, wherein the shutter plate is movable between a first position and a second position, wherein passages in the shutter plate in the first position align with passages in the distribution manifold, so that the sublimated source material passing through both the shutter plate and the distribution manifold deposits on an upper surface of the PV module substrates in the deposition area, wherein passages in the shutter plate in the second position are misaligned with passages in the distribution manifold so that the sublimated source material is blocked from passing through both the shutter plate and the distribution manifold to the deposition area; and conveying a plurality of the PV module substrates in a continuous non-stop manner through the deposition area.

4. The method of claim 3, further comprising moving the substrates through entrance and exit slots at opposite longitudinal ends of the deposition area, the entrance and exit slots defined by transversely extending entrance and exit seals disposed at a gap distance above the upper surface of the substrates and having a ratio of longitudinal length to gap distance of from about 10:1 to about 100:1.

5. The method of claim 4, further comprising heating the entrance and exit seals to a temperature greater than that of the PV module substrates conveyed through the deposition area.

6. The method of claim 3, further comprising heating the distribution manifold to a temperature greater than a sublimation temperature of the source material.

7. The method of claim 3, wherein the source material comprises CdTe.

* * * * *